United States Patent [19]

Nilsson et al.

[11] Patent Number: 5,438,637
[45] Date of Patent: Aug. 1, 1995

[54] ELECTRICALLY CONTROLLABLE OPTICAL FILTER DEVICE

[75] Inventors: Björn O. Nilsson, Fjäras; Pierre J. Rigole, Solna, both of Sweden

[73] Assignee: Telefonaktiebolaget LM Ericsson, Stockholm, Sweden

[21] Appl. No.: 162,873

[22] Filed: Dec. 8, 1993

[30] Foreign Application Priority Data

Dec. 9, 1992 [SE] Sweden ................. 9203781

[51] Int. Cl.$^6$ .................. G02B 6/12; G02B 6/10
[52] U.S. Cl. ........................ 385/10; 385/8; 385/14; 385/27; 385/37; 385/40; 385/131; 385/130
[58] Field of Search .............. 385/1, 2, 4, 7, 8, 9, 385/10, 14, 15, 27, 28, 39, 40, 37, 49, 129, 130, 131, 132

[56] References Cited

U.S. PATENT DOCUMENTS

| | | | |
|---|---|---|---|
| 3,813,142 | 5/1974 | Buhrer | 385/10 X |
| 4,006,963 | 2/1977 | Baues et al. | 385/10 X |
| 4,008,947 | 2/1977 | Baües et al. | 385/40 X |
| 4,054,362 | 10/1977 | Baues | 385/1 X |
| 4,057,321 | 11/1977 | Mahlein et al. | 385/2 X |
| 4,645,293 | 2/1987 | Yoshida et al. | 385/40 |
| 4,737,007 | 4/1988 | Alferness et al. | 385/37 X |
| 5,022,730 | 6/1991 | Cimini et al. | 385/37 X |
| 5,133,028 | 7/1992 | Okayama et al. | 385/11 |
| 5,233,187 | 8/1993 | Sakata et al. | 385/37 X |
| 5,285,274 | 2/1994 | Tanno et al. | 385/129 |

FOREIGN PATENT DOCUMENTS

| | | | |
|---|---|---|---|
| 267667 | 5/1988 | European Pat. Off. | 372/43 X |
| 2-282729 | 11/1990 | Japan | 385/40 X |

OTHER PUBLICATIONS

Patent Abstracts of Japan, vol. 14, No. 325 (P-1075), JP-A-02 106 717 (18 Apr. 1990).

*Primary Examiner*—Brian Healy
*Attorney, Agent, or Firm*—Burns, Doane, Swecker & Mathis

[57] ABSTRACT

An electrically controllable filter device is provided which comprises an electrode structure which induces a filter for waves within a given wavelength range. The electrode structure is so formed that it within the given wavelength range acts as a filter merely upon electrical feeding whereas it in the absence of electrical feeding has no filtering effect. Furthermore, the electrode structure is so arranged that the filter depending on how the electrode structure is fed can be tuned to a number of different discrete frequencies.

28 Claims, 5 Drawing Sheets

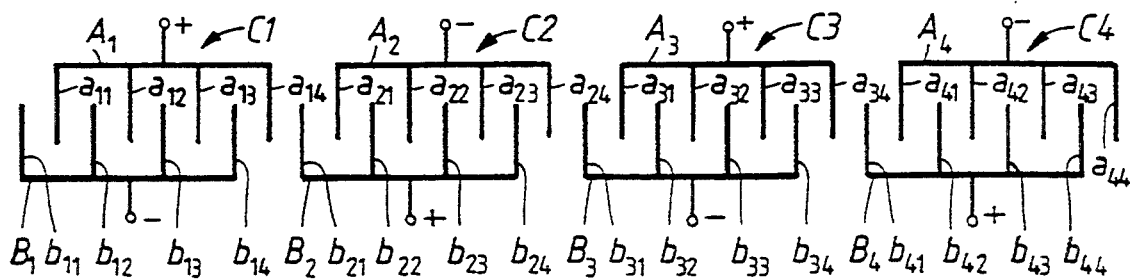
FIG.6a
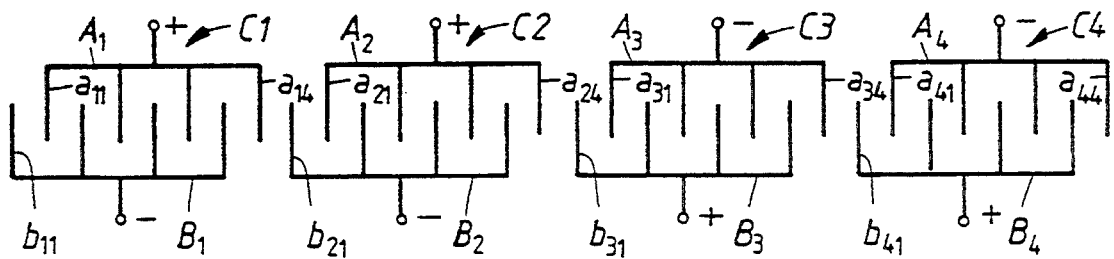
FIG.6b
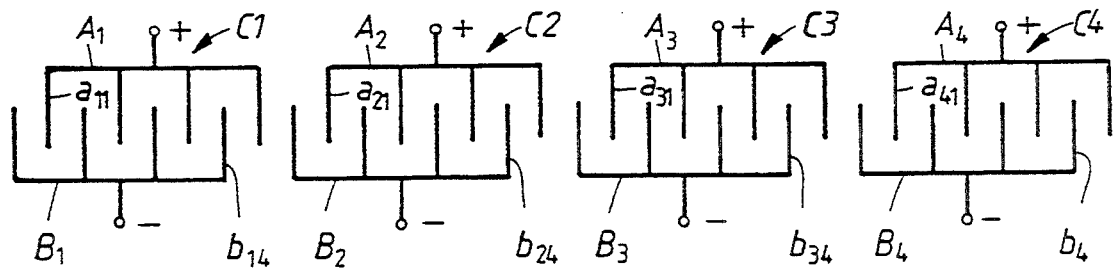
FIG.6c
FIG.7
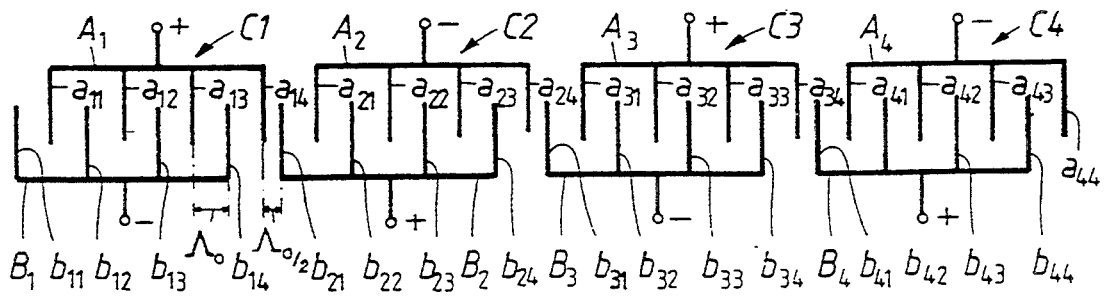

ELECTRICALLY CONTROLLABLE OPTICAL FILTER DEVICE

BACKGROUND

The present invention relates to an electrically controllable filter device. Such devices find their application within optics, but also within microwave technology etc. In the case of optical filters in waveguide form these are mostly fabricated in such a way that the grating is obtained in a boundary surface between two dielectrics close to the waveguide, e.g. through etching. Another way to obtain a filter structure is to make an electrode structure form a grating. It is in many cases desirable to be able to tune the grating as well as to control its strength which means that the effective refractive index of the waveguide mode has to be varied etc.

Devices as referred to above are known. These devices, however, work in such a way that a grating is introduced through the mere existence of the electrodes. The grating effect thereof is in some cases even stronger than that which can be controlled via electrical feeding. A consequence hereof is that the grating cannot be "shut off". This means consequently also that the strength cannot be controlled.

Through the European patent application EP-A-0 267 667 a DFB-laser is known which comprises an etched grating. With the use of a so called divided electrode structure the current injection can be controlled so that the period can be modified and it is thus possible to have an influence on those parts of the grating which are to be the predominanting. A grating is, however, always present and it cannot be shut off. U.S. Pat. No. 4,008,947 shows an electro-optic switch or a modulator wherein a grating can be created through the application of a voltage. However, this grating is not tunable and a change in periodicity cannot be achieved. So called DFB-, and DBR- lasers normally use an optical filter structure in a waveguide form wherein the grating for example is etched in a boundary surface between two dielectrics close to the waveguide as mentioned above. The grating thereby acts as when the grating period is $\lambda/2$. If it, however, is desired to tune the grating a change in effective refractive index for the waveguide mode is required which gives rise to a number of problems. It also involves substantial difficulties to control the strength of the grating. However, a strength control of the grating could be achieved through the use of a periodical variation in refractive index (real and/or imaginary part) induced in an electrical way through a periodical electrode configuration instead of an etched grating. The refractive index may e.g. be influenced through the electrooptic effect or through injection of charge carriers. However, as mentioned above, the electrodes as such give rise to a grating effect which particularly is so strong that it exceeds the desired grating effect which can be controlled electrically and it is impossible to completely eliminate the grating effect or to "shut off" the grating.

SUMMARY

It is an object of the present invention to provide an electrically controllable filter device which is tunable as well as it is possible to control the strength of the grating. It should also be possible to "shut off" the grating, e.g. to render it inactive so that the grating effect essentially is eliminated. A further object of the invention is to provide a device which is comparatively simple and cheap to fabricate. Furthermore, it is an object of the invention to provide a device with a great flexibility and which can be varied in a number of different ways. A further object of the invention is to provide a device which can be used for optical waves as well as for other waves such as e.g. microwaves. Those as well as other objects are achieved through device as initially stated which comprises an electrode structure inducing a filter for waves within a given wavelength range and which is so formed that it, within the given wavelength range, acts as filter merely upon electrical feeding whereas it in the absence of electrical feeding does not act as a filter and in that, the electrode structure is so arranged that the filter, depending on the electrode structure and the feeding thereof, can be tuned to a number of different discrete frequencies.

In one advantageous embodiment the device is so formed that it acts as a Bragg-reflector. According to a further embodiment the device is active, e.g. an active optical filter. Still another embodiment relates to an application in the form of a directional coupler.

BRIEF DESCRIPTION OF THE DRAWINGS

The invention will in the following be further described referring to the accompanying drawings in an explanatory and by no means limiting way, wherein FIG. 1 schematically illustrates a filter device comprising a waveguide and an electrode element, FIG. 2a schematically illustrates a device according to FIG. 1 in an electrooptical application forming a passive filter, FIG. 6b shows an embodiment of a divided structure with alternatively fed electrode structure, FIG. 6c illustrates a further embodiment of feeding of a divided electrode structure, FIG. 7 schematically illustrates an example of varying electrode periodicity.

DETAILED DESCRIPTION

Figure 1:
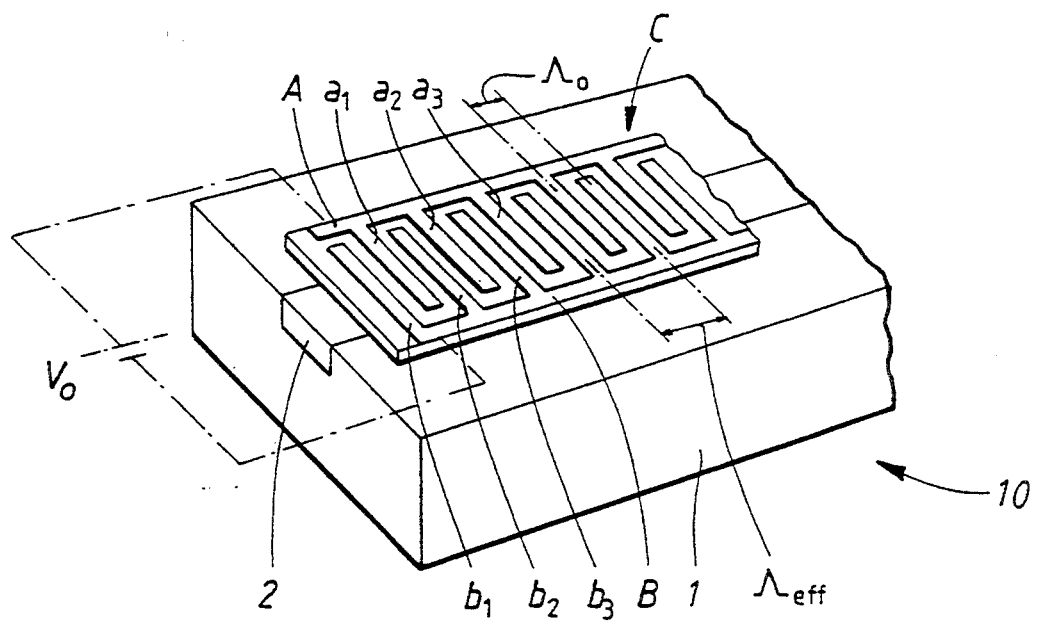
Figure 2B:
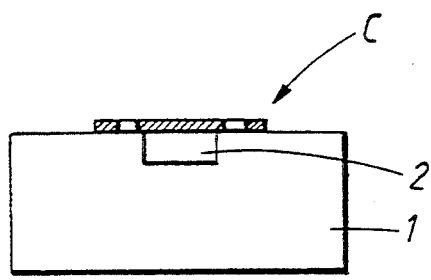
FIG. 2b is a plan view of the device of FIG. 2a, FIG. 3a schematically illustrates a device forming an active filter or laser in cross-section.
Figure 2A:
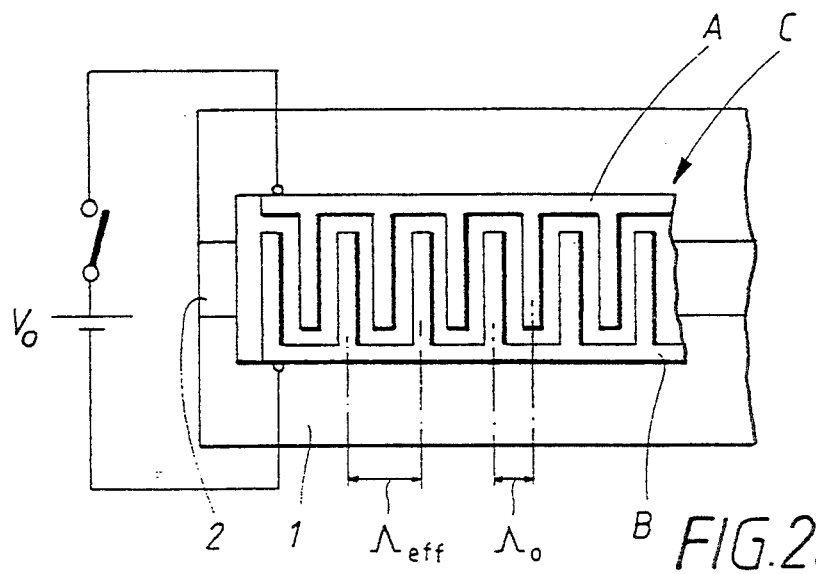

FIG. 1 shows a simplified embodiment of an electrically controllable filter device 10 comprising a waveguide with an electrode configuration which is so formed that it comprises an electrode structure which comprises an electrode element C comprising a first electrode A and a second electrode B respectively, wherein the electrodes A and B respectively comprise a number of electrode fingers $a_1, a_2, \ldots$ and $b_1, b_2 \ldots$ respectively wherein the fingers are arranged in an interdigital or interlocking manner. The electrode structure may also comprise several electrode elements or a great number. In this embodiment C designates one or more electrode elements for reasons of simplicity. If the electrodes A, B have the same potential, or in the absence of any feeding, a passive grating period $\Lambda_0$ is obtained with a period of approximately $\lambda_B/4$, $\lambda_B$ being the so called Bragg wavelength. A grating with this period essentially has no influence on the propagation of waves, i.e. the grating is rendered inactive or shut off. If, however, different voltages are applied to the electrodes A and B respectively, a grating is obtained which has an effective grating period $\Lambda_{eff}$ which approximately is equal to $\lambda_B/2$, wherein $\lambda_B$ represents the so called Bragg wavelength. In this case a strong reflection is obtained and the strength of this can be controlled electrically from the starting value (0) and upwards. Consequently, no reflection is obtained without application of a voltage whereas if a voltage is applied, Bragg reflection is obtained. In FIGS. 2a and 2b a device is more thoroughly illustrated which in this case is electrooptically constructed i.e. based on the electrooptical effect through an electrooptical substrate. In FIG. 2a an electrode element C is illustrated which comprises a first electrode A and a second electrode B, wherein the first and the second electrodes A, B respectively comprise a number of electrode fingers $a_1, a_2, \ldots$ and $b_1, b_2, \ldots$ respectively wherein the electrodes A, B are connected to a voltage source $V_0$ and wherein the circuit comprises a contact breaker. FIG. 2a illustrates the electrode structure with an underlying optical waveguide 2 and a substrate 1 e.g. of LiNbO$_3$. Of course also other materials can be used. In FIG. 2b a transversal cross-section of the device is shown wherein a substrate 1 (e.g. LiNbO$_3$) with a first refractive index $n_1$ in which runs an optical waveguide 2 with a refractive index $n_2$. An electrode structure in the form of an electrode element C comprising metal, is arranged on top. In this particular embodiment, forming a passive filter, the refractive index $n_1$ can be approximately the same as $n_2$ and for example be about 2,2. The difference between the retractive indices, $n_2 - n_1$ may be approximately e.g. $10^{-2}$ or in some cases somewhat more. The waveguide 2 may have a thickness of approximately 0,5–2 $\mu$m and a width which is about 5 $\mu$m, but these values are merely given as examples. The length of the device can be of the cm order of magnitude. The optical waveguide 2 has a refractive index $n_2$ which somewhat exceeds the refractive index $n_1$ of the substrate 1 and may for example be fabricated through Ti In diffusion or proton exchange of the LiNbO$_3$-substrate in a way which is known per se. The device functions in such a way that if the contact breaker (FIG. 2a) is disconnected, a grating is present which has the period $\Lambda_0$ as described above and which thus does not have an influence on lightwaves with the wavelength 4·$\Lambda_0$. With a connected contact breaker, a grating is induced which has the periodicity $\Lambda_{eff}$ and which has a strong influence on a wave with a wavelength $\lambda$ approximately equal to 2·$\Lambda_{eff}$. Depending on how the electrodes are fed the filter can be tuned to a number of different, discrete frequencies. As an example, with the free wavelength $\Lambda_0$ approximately equal to 1,5 $\mu$m, $\lambda$ gets approximately equal to 1 $\mu$m and $\Lambda_{eff}$ approximately gets equal to 0,5 $\mu$m.

Figure 3A:
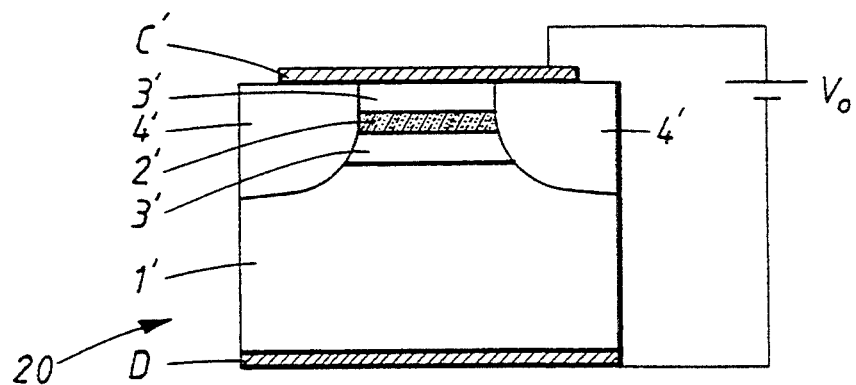
FIG. 3b is a longitudinal view of the device of FIG. 3a, FIG. 4 schematically illustrates an embodiment comprising two waveguides and forming a grating assisted directional coupler.
Figure 3B:
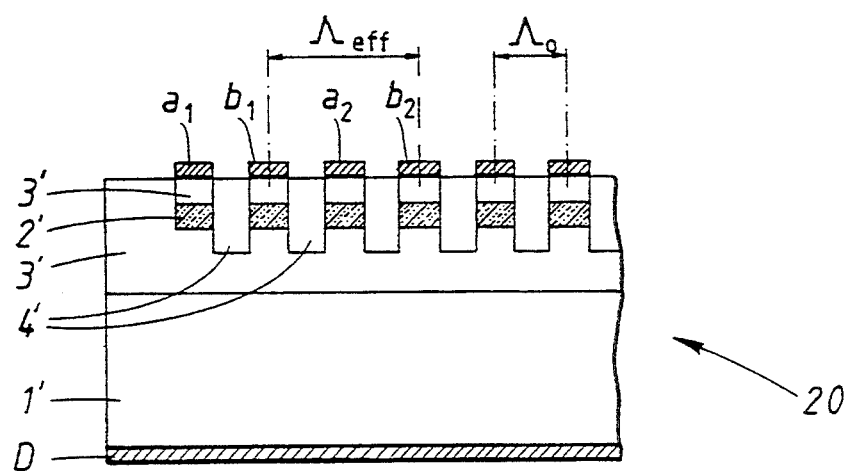

In FIG. 3 is shown an example of the filter device in a charge carrier injection application forming an active filter or laser. For a filter device 20 of this type the electrode structure can be essentially the same as the electrode structure of the in the foregoing illustrated embodiment whereas the difference lies in the optical waveguide 2' which now has an electronic function in a manner known per se. FIG. 3a shows a filter device 20 in a transversal cross-section connected to a voltage source $V_0$. The device comprises an electrode structure C' which may comprise one of more electrode elements which will be described later on. The device furthermore comprises a lower electrode D in a manner known per se. In the figure the substrate 1' has a refractive index $n_1$, which is approximately the same as the refractive index $n_2$ of an isolating or semi-isolating layer 4' in a manner known per se. The structure of the device essentially forms a normal so called buried heterostructure of a semiconductor laser. It is important that the distance between the electrode structure C and the active layer 2' is comparatively small in the shown embodiment. The active layer 2' has a refractive index $n_2$. which is greater than the refractive index $n_3$. of semi-conducting layer 3', 3' arranged on both sides of the active layer 2', which in turn has a refractive index which is greater than the refractive index $n_1$, of the substrate 1' and the isolating or semi-isolating layers 4' with refractive index $n_4$ respectively. The active layers may particularly have the form of quantum wells or quantum wires. If the active areas or layers are sufficiently thin, quantum wires are obtained. In FIG. 3b the filter device 20 according to FIG. 3a is shown in a longitudinal view wherein the alternating electrode fingers $a_1$, $b_1$, $a_2$, $b_2$, of the electrodes A, B have an effective grating period $\Lambda_{eff}$. In the shown embodiment electrodes A (electrode fingers $a_1, a_2, \ldots$) are fed with a current which is lower than the current with which the electrode B (electrodefingers $b_1, b_2, \ldots$) is fed. Alternatively the electrode A (with thereto belonging fingers) may be left free. The gaps 4' form isolating gaps which for example may comprise semi-isolating or semi-conducting material or an oxide whereas the layers 1', 2', 3' comprise a semiconducting material, wherein the injection is carried out in the active layer 2'. As an example would with a wavelength $\lambda_0$ of about 1,5 $\mu$m, $\lambda$ be approximately 0,5 $\mu$m and $\Lambda_{eff}$ approximately 0,25 $\mu$m. The total length of a filter device 20 according to what has been described herein can be as much as approximately 0,1–1 mm. Numerical values are merely given as examples. According to one embodiment of the invention (not further described here) may, in addition to a tuning to different discrete frequencies, also a so called continuous tuning be carried out which consists in a continuous variation in refractive index in a manner known per se.

Figure 4:
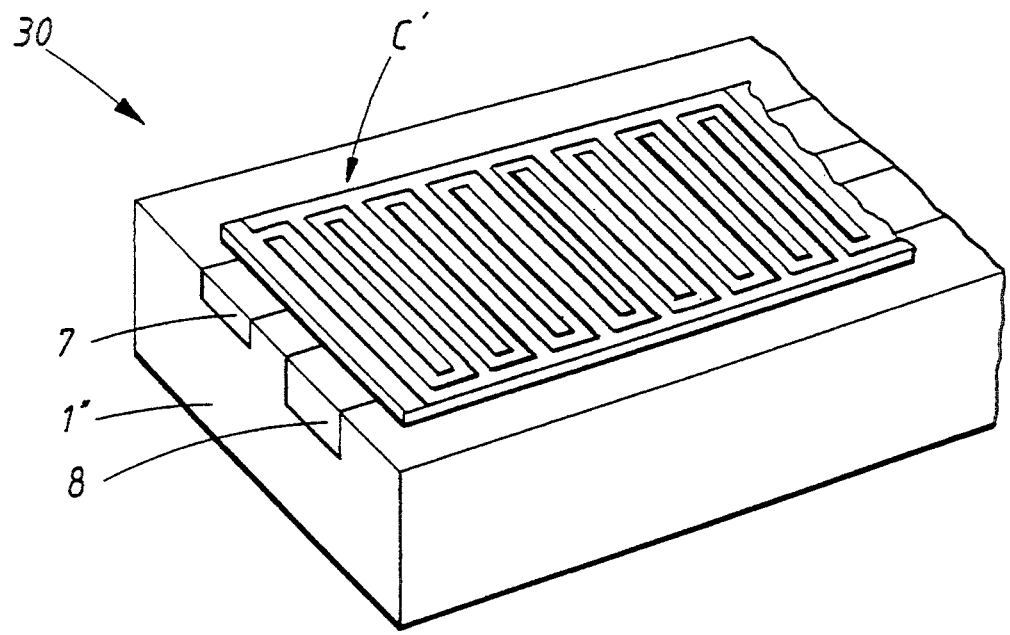
FIG. 4a is a simplified cross-sectional view of FIG. 4, FIG. 4b schematically illustrates an electrode structure-coupling arranged in groups of a grating assisted directional coupler.
Figure 4A:
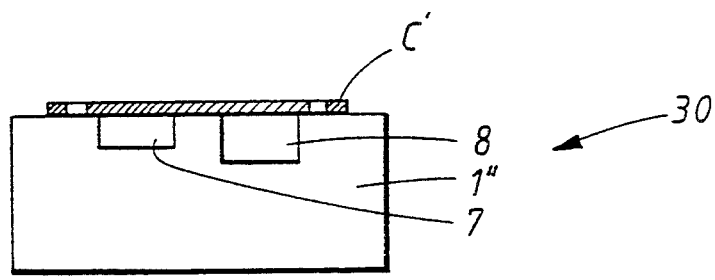
Figure 4B:
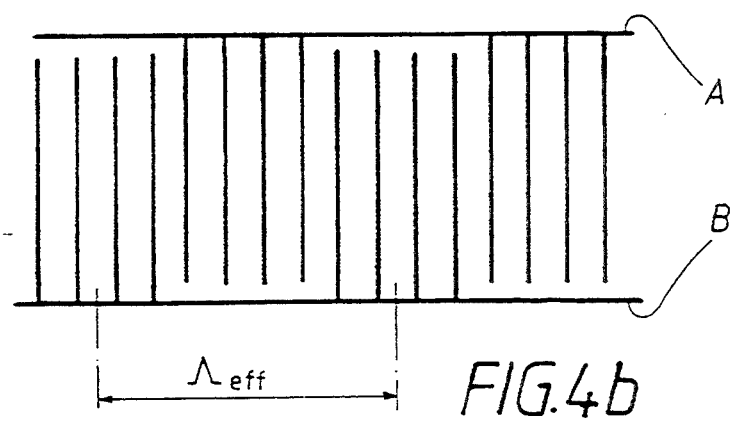

According to an alternative embodiment the filter device may take the form of a grating assisted directional coupler. In FIG. 4 a filter device 30 is shown very schematically which comprises a first and a second waveguide 7, 8 respectively and a substrate 1" on top of which is arranged an electrode structure, here in the form of an electrode element C in a manner essentially analogue to what has been described above. In FIG. 4a is likewise schematically a transversal view of the device 30 shown comprising two different waveguides 7, 8 with refractive indices $n_7$, $n_8$ respectively on which an electrode structure is arranged and which are arranged in a substrate 1?' with the refractive index $n_{1''}$. Since the waveguides 7, 8 are different, they have, at the same frequency, different propagation constants for which $k_7(\omega)=2\pi/\lambda_7(\omega)$ and $k_8(\omega) =2 \pi/\lambda_8(\omega)$ respectively and the frequency is $\omega/2\pi$. The grating induced through the electrodes A, B, comprised by the electrode structure which has an effective grating period $\Lambda_{eff}$ gives rise to a coupling between the waveguides 7, 8 provided that $k_7(\omega)-k_8(\omega)=k_g$ wherein $k_g$ is the wave number which should be $\pm 2\pi/\Lambda_{eff}$. Analogue to the preceding embodiments the filter device 30 can be controlled via the electrodes A, B. However, in some cases the electrode periodicity $\Lambda_0$ should be considerably smaller than the smallest desired grating periodicity $\Lambda_{eff}$ in order to avoid that coupling occurs through the presence of the electrode structure as such. In order to solve this problem the electrodes or the electrode fingers may however be arranged in groups as schematically illustrated in FIG. 4b and in such a way that an effective grating period $\Lambda_{eff}$ is formed between groups of electrode fingers.

Figure 5:
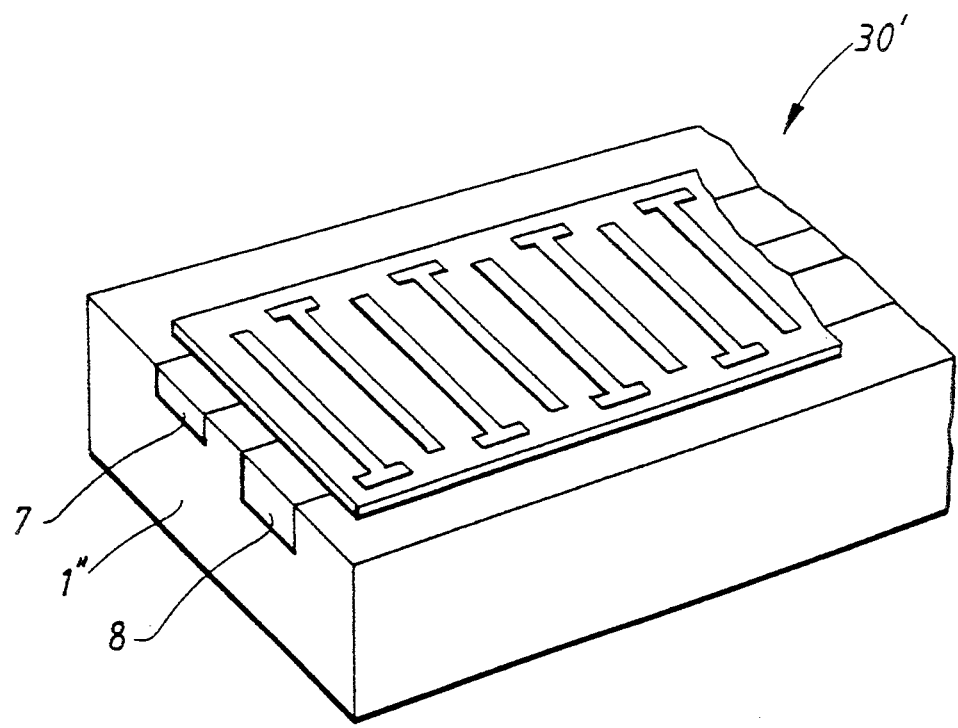
FIG. 5 shows an alternative embodiment of a grating assisted directional coupler, FIG. 5a schematically illustrates an example of feeding of the device of FIG. 5, FIG. 6a schematically illustrates an embodiment of a divided electrode structure with alternate feeding of consecutive electrode elements.
Figure 5A:
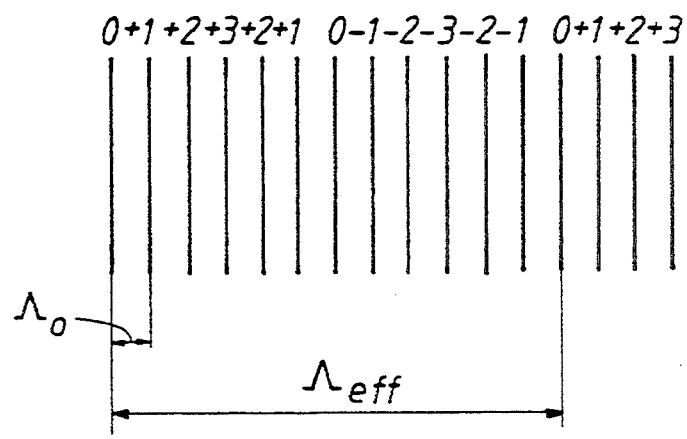

In FIG. 5 an alternate embodiment of the filter device 30' is shown, each electrode finger forming an electrode which is fed, or controlled, separately.

Herein the (longer) grating period which is required for the coupling between the two waveguides is utilised. It is given by the difference between the wave propagation constants of the two waveguides and normally it is about 40–100 times the grating period of a DFB-laser. The electrode period may be a fraction of the grating period and since each electrode finger is fed or controlled separately, a "sinus-shaped grating" can be obtained of which the frequency as well as the strength is tunable.

The distances between possible frequencies are given by the relationship between the electrode period and grating period, i.e. the period which couples the waveguide to the average-light frequency which is used. The electrode period should, however, not be the same as for a DFB-laser since coupling between advancing and retrograding wave respectively occurs through the mere presence of the electrode structure.

In FIG. 5$a\pm n$, $n=0,\pm 1, \ldots$ denote voltage or current level and $\Lambda_{eff}$ denote the period of the sine-shaped curve. Alternatively the grating could e.g. be controlled in such a way that a square wave is obtained.

In the following will be described how the electrode structure can be divided longitudinally so that it comprises a number of electrode elements C1, C2, C3, C4, . . . wherein the different electrode elements can be arranged or fed respectively in different ways so that e.g. a filter device can be obtained which is tunable to a discrete number of wavelengths. In FIG. 6a is illustrated an embodiment with a number of electrode elements C1, C2, . . . each comprising a first and a second electrode respectively $A_1, B_1; A_2, B_2; A_3, B_3; A_4, B_4; \ldots$ wherein each first and second electrode comprise electrode fingers $a_{11}, a_{12}, a_{13}, a_{14}$ and $b_{11}, b_{12}, b_{13}, b_{14}$ etc. and analogue for further electrode elements.

In the embodiment shown in FIG. 6a the first electrodes $A_1, A_2, \ldots$ are alternatingly denoted with +, − etc. whereas the corresponding second electrodes $B_1, B_2, \ldots$ carry the opposite sign. In certain cases the electrode elements are fed in an alternating way with a period which we here call electrodeelement period and which in this particular case is 2. Plus (+) will in the following mean that an electrode is fed with a current (or a voltage is applied) which is higher than the one denoted minus, which thus can be lower than the one denoted plus (+) or mean that no feeding occurs. With polarities as shown in FIG. 6a an effective grating period is obtained which is approximately $\Lambda_{eff}\times \frac{7}{8}$ or $\Lambda_{eff}9/8$, i.e. both periods are obtained. Depending on how the electrodes are fed, different effective grating periods are obtained. A typical DFB-laser comprises for example more than 1000 grating periods wherethrough a very large number of different variation possibilities are obtained; the smallest relative tuning is about 1/the number of periods.

In FIG. 6b an alternate embodiment of feeding of electrode elements is shown wherein the electrode elements are fed in the same way in groups of two, i.e. if two first electrodes in an electrode element are fed in one and the same way they are followed by two first electrodes which are fed differently etc. ($\Lambda_{eff}$ is approximately 15/16 (and 17/16). This is however, merely given as an example. Different groups are possible, i.e. groups could be arranged in various ways, electrodes can be fed separately or individually etc.

In FIG. 6c a further embodiment is illustrated of how the electrode elements or the electrodes respectively can be fed. In this embodiment each electrode element is fed in one and the same way. In the embodiment shown in FIGS. 6a–6c the electrode elements are so arranged in relation to each other that the electrode periodicity is constant all the time. It is, however, also possible to vary the electrode periodicity which is illustrated in FIG. 7. The distance between two electrode fingers $a_{14}, b_{21}$ belonging to different electrode elements C1; C2 could e.g. here be the half of the distance $\Lambda_0/2$ between electrode fingers comprised by an electrode element. In this embodiment the duplicity which has been described in the foregoing (in relation to FIG. 6a) essentially no longer exists, but the number of wavelengths which can be tuned will be limited.

Through the present invention it is thus possible to tune as well as to control the strength of a filter and it can be said to give rise to an electrical synthesizing of different spatial frequencies. The invention may find its application within a large number of different areas such as e.g. modulatable filters for large WDM's and for signal processing or as a tunable laser for a WDM.

According to one advantageous embodiment wherein the device is arranged on a chip a processor could be integrated on the same chip which controls and takes care of numerous connections which are involved.

The invention shall of course not be limited to the shown embodiments, but it can be freely varied in a number of ways within the scope of the claims. The electrode structure and combinations of electrode elements may take many different forms and the feeding thereof can also be carried out in many different ways. Also a number of different materials can be used and the number of tunable wavelengths can be different etc.

What is claimed is:

1. An electrically controllable filter device comprising:
   a substrate;
   an optical waveguide disposed on the substrate; and
   an electrode structure for inducing a filtering of waves within a given wavelength range that propagate through the optical waveguide,
   wherein the electrode structure is so formed with respect to the optical waveguide that the electrode structure, within the given wavelength range, induces the filtering merely upon electrical feeding of the electrode structure whereas the electrode structure in the absence of electrical feeding does not induce the filtering; the electrode structure is so arranged that the filter, depending on the electrode structure and the feeding thereof, can be tuned to a plurality of different discrete frequencies; the electrode structure in the absence of feeding has a passive grating period $\Lambda_0$, and upon feeding has an effective grating period, $\Lambda_{eff}$, which is greater than the passive grating period $\Lambda_0$, and wherein the effective grating period $\Lambda_{eff}$ through variation in feeding can vary.

2. A device as in claim 1 wherein the effective grating period $\Lambda_{eff}$ is approximately $\Lambda_0 \cdot 2$ so that the filter works as a Bragg-reflector for waves with the wavelength $\lambda \approx 2 \cdot \Lambda_{eff}$.

3. A device as in claim 1 wherein the passive grating period, $\Lambda_0$, approximately takes one of the values $\Lambda_{eff}/4$, $\Lambda_{eff}/8$, $\Lambda_{eff}/3$ and $\Lambda_{eff}/6$.

4. A device according to claim 1, wherein the electrode structure comprises at least one electrode element, wherein the electrode element comprises at least a first and a second electrode.

5. A device as in claim 4, wherein the first and the second electrodes are fed separately and differently.

6. A device as in claim 4 wherein the first and the second electrode have a finger structure, wherein fingers within each electrode are directed towards each other and at least partially are interdigitally arranged.

7. A device as in claim 4 wherein the electrode structure is longitudinally divided in a plurality of consecutive electrode elements, each comprising a first and a second electrode.

8. A device as in claim 7 wherein all electrode elements are fed electrically in the same way.

9. A device as in claim 7 wherein the electrode elements comprised of the electrode structure have an alternating polarity so that consecutive first electrodes have different polarities and consecutive second electrodes have different polarities.

10. A device as in claim 7 wherein a polarity of the electrode elements of the electrode structure is such that two electrode elements which are equally fed, are followed by two differently fed electrode elements etc.

11. A device as in claim 7 wherein an electrode periodicity is constant.

12. A device as in claim 7 wherein one of an electrode periodicity and an electrode element periodicity varies.

13. A device as in claim 11 wherein the electrode periodicity of a first electrode element differs from the electrode periodicity of a consecutive electrode element.

14. A device as in claim 5, wherein the electrode structure induces an optical filter.

15. A device as in claim 14 forming a passive optical filter.

16. A device as in claim 15, wherein the electrode structure is formed with respect to the optical waveguide disposed on an electro-optical substrate.

17. A device as in claim 14, wherein the electrode structure induces an active optical filter.

18. A device as in claim 17 comprising one of a DFB-laser and a DBR-laser.

19. A device as in claim 17 wherein $\Lambda_0 \approx \Lambda_{eff}/3$.

20. An electrically controllable filter comprising:
an optical waveguide; and
an electrode structure for inducing a filtering effect for waves within a given wavelength range that propagate through the optical waveguide;
wherein the electrode structure is so formed with respect to the optical waveguide that the electrode structure, within the given wavelength range, induces the filtering effect merely upon electrical feeding of the electrode structure whereas in the absence of electrical feeding the filtering effect is negligible; the electrode structure is so arranged that the filtering effect, depending on the electrode structure and, the feeding thereof, can be tuned to a plurality of different discrete frequencies; the electrode structure in the absence of feeding has a passive grating period, $\Lambda_0$, and the electrode structure upon feeding has an effective grating period, $\Lambda_{eff}$, which is greater than the passive grating period $\Lambda_0$, and for a given electrode structure the effective grating period $\Lambda_{eff}$ through variation in feeding can take one of a plurality of different values.

21. A device according to claim 20 wherein $\Lambda_{eff}$ is approximately $\Lambda_0 \cdot 2$ so that the filter works as a Braggreflector for waves having a wavelength $\lambda \approx 2 \cdot \Lambda_{eff}$.

22. A device as in claim 20 wherein the passive grating period, $\Lambda_0$, approximately takes one of the values, $\Lambda_{eff}/4$, $\Lambda_{eff}/8$, $\Lambda_{eff}/3$ and $\Lambda_{eff}/6$.

23. An electrically controllable active optical filter comprising:
a substrate;
an active optical layer, disposed on the substrate, for receiving injected charge carriers;
an electrode structure for inducing a filtering effect for optical waves within a given wavelength range that propagate through the active optical layer;
wherein the electrode structure is so formed with respect to the active optical layer that the electrode structure, within the given wavelength range, induces the filtering effect merely upon electrical feeding of the electrode structure whereas in the absence of electrical feeding the filtering effect is negligible; the electrode structure is so arranged that the filtering effect, depending on the electrode structure and the feeding thereof, can be tuned to a plurality of different discrete frequencies; the electrode structure in the absence of feeding has a passive grating period $\Lambda_0$, and upon feeding has an effective grating period, $\Lambda_{eff}$, which is greater than the passive grating period $\Lambda_0$, which varies through variation in feeding.

24. An active optical filter as in claim 23 wherein $\Lambda_{eff}$ is approximately $\Lambda_0 \cdot 2$ whereby the filter is a Braggreflector for waves having a wavelength $\lambda \approx 2 \cdot \Lambda_{eff}$.

25. An active optical filter as in claim 23 wherein the passive grating period, $\Lambda_0$, approximately takes one of the values, $\Lambda_{eff}/4$, $\Lambda_{eff}/8$, $\Lambda_{eff}/3$ and $\Lambda_{eff}/6$.

26. An active optical filter as in claim 23, comprising one of a DFB-laser and a DBR-laser.

27. A device as in claim 1, wherein the electrode structure comprises at least one electrode that includes commonly fed electrode fingers, and $$h = \frac{\Lambda_{eff}}{\Lambda_0}$$

(h = 1, 2, ..., n) is so small that the electrode structure does not cause any coupling in the absence of electrical feeding.

28. A device as in claim 27 wherein that the electrode fingers are connected groupwise so that each electrode finger comprises a number of electrode fingers.

* * * * *